(12) United States Patent
Lewis et al.

(10) Patent No.: US 8,191,757 B2
(45) Date of Patent: Jun. 5, 2012

(54) REDUCING JOINT EMBRITTLEMENT IN LEAD-FREE SOLDERING PROCESSES

(75) Inventors: Brian G. Lewis, Branford, CT (US); Bawa Singh, Voorhees, NJ (US); John Laughlin, Tucson, AZ (US); Ranjit Pandher, Plainsboro, NJ (US)

(73) Assignee: Fry's Metals, Inc., South Plainfield, NJ (US)

( * ) Notice: Subject to any disclaimer, the term of this patent is extended or adjusted under 35 U.S.C. 154(b) by 717 days.

(21) Appl. No.: 12/036,604

(22) Filed: Feb. 25, 2008

(65) Prior Publication Data
US 2008/0160310 A1 Jul. 3, 2008

Related U.S. Application Data

(63) Continuation-in-part of application No. PCT/GB2006/003159, filed on Aug. 24, 2006.

(60) Provisional application No. 60/710,916, filed on Aug. 24, 2005.

(51) Int. Cl.
*B23K 31/02* (2006.01)

(52) U.S. Cl. .............................. 228/180.21; 228/180.22

(58) Field of Classification Search ........................ None
See application file for complete search history.

(56) References Cited

U.S. PATENT DOCUMENTS

| | | | |
|---|---|---|---|
| 4,920,074 A * | 4/1990 | Shimizu et al. ................. | 29/827 |
| 5,248,079 A * | 9/1993 | Li ................................ | 228/121 |
| 5,819,406 A * | 10/1998 | Yoshizawa et al. ............. | 29/877 |
| 6,429,388 B1 | 8/2002 | Interrante et al. | |
| 7,159,758 B1 * | 1/2007 | Downes et al. ............. | 228/248.1 |
| 7,798,389 B2 * | 9/2010 | Ikeda et al. ................... | 228/224 |
| 2004/0177997 A1 | 9/2004 | Hata et al. | |
| 2005/0127143 A1 * | 6/2005 | Kubokawa et al. ...... | 228/180.21 |
| 2006/0115994 A1 * | 6/2006 | Shimokawa et al. ......... | 438/771 |
| 2007/0031279 A1 * | 2/2007 | Soga et al. .................... | 420/470 |
| 2007/0074790 A1 * | 4/2007 | Yamakoshi et al. .......... | 148/426 |
| 2007/0085178 A1 * | 4/2007 | Seki et al. ..................... | 257/676 |
| 2007/0090156 A1 * | 4/2007 | Ramanathan et al. ........ | 228/101 |
| 2008/0070059 A1 * | 3/2008 | Takaoka et al. ............... | 428/647 |
| 2008/0182124 A1 * | 7/2008 | Gruber et al. ................. | 428/646 |
| 2008/0206590 A1 * | 8/2008 | Ikeda et al. ................... | 428/650 |
| 2008/0230589 A1 * | 9/2008 | Guth et al. .................... | 228/193 |
| 2008/0237314 A1 * | 10/2008 | Yu et al. ........................ | 228/245 |
| 2008/0246064 A1 * | 10/2008 | Kimura ......................... | 257/292 |
| 2009/0114431 A1 * | 5/2009 | Kuroda et al. ................ | 174/257 |

(Continued)

FOREIGN PATENT DOCUMENTS
EP 0629464 12/1994
(Continued)

OTHER PUBLICATIONS

Machine translation of JP-2003-332731A (no date available).*

(Continued)

*Primary Examiner* — Kiley Stoner
(74) *Attorney, Agent, or Firm* — Senniger Powers LLP

(57) ABSTRACT

In the manufacture of products such as printed wiring boards or chip scale packaging and ball grid arrays, incorporating one or more elements selected from among Ni, Co, Cr, Mn, Zr, Fe and Si into a lead-free soldering process to reduce joint embrittlement. In varied embodiments this is accomplished by spraying onto a solder sphere or preform surface, by spraying onto a device substrate surface, or by incorporating into the device substrate alloy.

21 Claims, 1 Drawing Sheet

U.S. PATENT DOCUMENTS

Figure 1A:
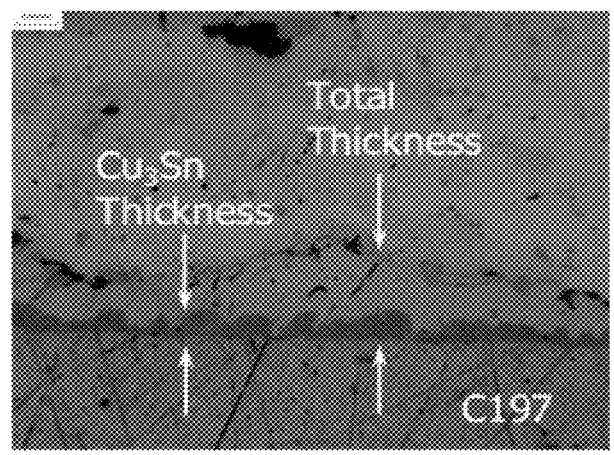

| | | | |
|---|---|---|---|
| 2009/0121119 A1* | 5/2009 | Nishi et al. | 250/214 LS |
| 2009/0142888 A1* | 6/2009 | Tsuchiya | 438/151 |
| 2009/0173770 A1* | 7/2009 | Izumida et al. | 228/173.5 |
| 2009/0197114 A1* | 8/2009 | Shih et al. | 428/647 |
| 2009/0278252 A1* | 11/2009 | Oikawa et al. | 257/702 |
| 2009/0291321 A1* | 11/2009 | Hooghan et al. | 428/647 |
| 2009/0304545 A1* | 12/2009 | Tanaka et al. | 420/561 |
| 2010/0103634 A1* | 4/2010 | Funaya et al. | 361/761 |
| 2010/0195292 A1* | 8/2010 | Ide et al. | 361/748 |
| 2010/0203353 A1* | 8/2010 | Anderson et al. | 428/646 |
| 2010/0243300 A1* | 9/2010 | Amin et al. | 174/257 |
| 2010/0330729 A1* | 12/2010 | Sugawara et al. | 438/70 |

FOREIGN PATENT DOCUMENTS

| | | |
|---|---|---|
| EP | 1163971 | 12/2001 |
| JP | 8051178 | 2/1996 |
| JP | 2002178191 | 6/2002 |
| JP | 2002198461 | 7/2002 |
| JP | 2003332731 | 11/2003 |

OTHER PUBLICATIONS

International Search Report, PCT/GB2006/003159, dated Nov. 17, 2006, 4 pages.

Written Opinion, PCT/GB2006/003159, dated Nov. 17, 2006, 7 pages.

Abstract of JP2003332731; Nov. 21, 2003.

Abstract if JP2002198461; Jul. 12, 2002.

Abstract of JP2002178191; Jun. 25, 2002.

Abstract of JP8051178; Feb. 20, 1996.

* cited by examiner

REDUCING JOINT EMBRITTLEMENT IN LEAD-FREE SOLDERING PROCESSES

REFERENCE TO RELATED APPLICATIONS

This application is a continuation-in-part of PCT application PCT/GB2006/003159, filed 24 Aug. 2006 and claiming priority to U.S. provisional application 60/710,916, filed 24 Aug. 2005, the entire disclosures of which are incorporated herein by reference.

FIELD OF THE INVENTION

The present invention relates to the technology of soldering and, in particular, to improved lead-free solder joints for electronic soldering applications, involving printed wiring boards or chip scale packaging and ball grid arrays.

For environmental reasons, there is an increasing demand for lead-free replacements for lead-containing conventional alloys. These alloys typically contain silver and copper additions to tin, and are used in many of the soldering processes required for the manufacture of components and the joining of components to printed wiring boards.

Molten solder alloys tend to dissolve the substrate and to form an intermetallic compound at the interface with the substrate. For example, tin in the solder alloy will react with the substrate at the interface to form an inter metallic. If the substrate is copper, then a layer of $Cu_6Sn_5$ will be formed. Such a layer typically has a thickness of from a fraction of a micron to a few microns. At the interface between this layer and the copper substrate an intermetallic compound of $Cu_3Sn$ may also be present. Such intermetallic compounds may result in a brittle solder joint. In some cases, voids occur, which may further contribute to premature fracture of a stressed joint. This may particularly be the case when the intermetallic interfacial layers grow during the ageing after soldering and during service.

SUMMARY OF THE INVENTION

Briefly, therefore, the invention is directed to a method of forming a solder joint, comprising (a) providing a lead-free, tin-containing solder alloy; (b) providing a printed wiring board substrate or a ball grid array substrate, said substrate being formed from a material comprising copper, optionally also zinc, and one or more of Ni, Co, Cr, Mn, Zr, Fe and Si and/or alloys thereof; (c) heating the solder alloy; and (d) either before, during or after step (c) contacting the solder alloy with the substrate.

The invention is also directed to a method of forming a solder joint, comprising (a) providing a lead-free, tin-containing solder alloy; (b) providing a printed wiring board substrate or a ball grid array substrate, said substrate being formed from a material comprising copper and optionally also zinc; (c) depositing one or more of Ni, Co, Cr, Mn, Zr, Fe and Si and/or alloys thereof on a surface of the substrate; (d) heating the solder alloy; and (e) either before, during or after step (d) contacting the solder alloy with said surface of the substrate.

The invention is further directed to a method of forming a solder joint, comprising (a) providing a lead-free, tin-containing solder alloy; (b) forming the solder alloy into spheres or other preforms; (c) depositing on the surface of the spheres or other preforms one or more of Ni, Co, Cr, Mn, Zr, Fe and Si and/or an alloy thereof; (d) providing a printed wiring board substrate or a ball grid array substrate, said substrate being formed from a material comprising copper and optionally also zinc; (e) heating the solder alloy spheres or other preforms; and (f) either before, during or after step (e) contacting the solder alloy with said surface of the substrate.

Another aspect of the invention is a printed wiring board substrate or a ball grid array substrate, the substrate being formed from an alloy comprising copper, optionally zinc, and one or more of Ni, Co, Cr, Mn, Zr, Fe and Si and/or an alloy of any one or more thereof.

The invention is also directed to a lead-free, tin-containing solder alloy in the form of spheres or a preform, wherein the surface of the spheres or perform has deposited thereon one or more of Ni, Co, Cr, Mn, Zr, Fe and Si and/or an alloy of any one or more thereof.

Other objects and aspects of the invention will be in part apparent and in part pointed out hereinafter.

DETAILED DESCRIPTION OF PREFERRED EMBODIMENTS

It has been found that certain alloying elements inhibit the growth of the interfaces, thereby prolonging the effective life of a solder joint. These elements include, for example, Ni, Co, Cr, Mn, Zr, Fe and Si. The inventors have found, however, that there can be problems associated with the incorporation of these elements into solder alloy compositions. In particular, problems can arise during fabrication of the alloys into the form desired for their use. For example, high volume manufacture of solder spheres is typically achieved using liquid metal jetting. In this process molten alloy is required to flow through a small diameter hole in a nozzle prior to being broken up in to droplets of a fixed size and then solidified as a sphere in a cooling column. The inventors have found that the presence of certain alloying elements at higher concentrations can result in unmelted or undissolved intermetallic compounds. These intermetallic compounds can block the nozzle, causing loss of jet or spray stability, and sometimes a complete cessation of liquid metal flow.

The present invention aims to address at least some of the problems associated with the prior art and to provide improved solder alloy joints.

Accordingly, in a first aspect the present invention provides a method of forming a solder joint, comprising:
  (a) providing a lead-free, tin-containing solder alloy;
  (b) providing a printed wiring board substrate or a ball grid array substrate, said substrate being formed from a material comprising copper, optionally also zinc, and one or more of Ni, Co, Cr, Mn, Zr, Fe and Si and/or alloys thereof;
  (c) heating the solder alloy; and
  (d) either before, during or after step (c) contacting the solder alloy with the substrate.

In a second aspect the present invention provides a method of forming a solder joint, comprising:
  (a) providing a lead-free, tin-containing solder alloy;
  (b) providing a printed wiring board substrate or a ball grid array substrate, said substrate being formed from a material comprising copper and optionally also zinc;
  (c) depositing one or more of Ni, Co, Cr, Mn, Zr, Fe and Si and/or alloys thereof on a surface of the substrate;
  (d) heating the solder alloy; and
  (e) either before, during or after step (d) contacting the solder alloy with said surface of the substrate.

The step of depositing the one or more of Ni, Co, Cr, Mn, Zr, Fe and Si (including alloys of any one or more thereof) on said surface of the substrate may be achieved by plating, spraying and/or vapour deposition. For example, the spraying may comprise plasma, arc or flame spraying. The vapour deposition may comprise chemical vapour deposition or evaporation, sputtering or ion implantation.

In a third aspect the present invention provides a method of forming a solder joint, comprising:
(a) providing a lead-free, tin-containing solder alloy;
(b) forming the solder alloy into spheres or other preform;
(c) depositing on the surface of the spheres or other preform, one or more of Ni, Co, Cr, Mn, Zr, Fe and Si and/or an alloy thereof;
(d) providing a printed wiring board substrate or a ball grid array substrate, said substrate being formed from a material comprising copper and optionally also zinc;
(e) heating the solder alloy spheres or other preforms; and
(f) either before, during or after step (e) contacting the solder alloy with said surface of the substrate.

The step of depositing one or more of Ni, Co, Cr, Mn, Zr, Fe and Si (including alloys of any one or more thereof) on the surface of the spheres or preform may be achieved by plating, spraying and/or vapour deposition. The spraying may comprise plasma, arc or flame spraying. The vapour deposition may comprise chemical vapour deposition or evaporation, sputtering or ion implantation.

The presence of the Ni Co, Cr, Mn, Zr, Fe and/or Si introduced to the solder-substrate interface by means of the present invention has a beneficial effect in reducing joint embrittlement.

Heating of the solder alloy results in the alloy becoming fully or substantially molten.

As used herein, the term ball grid array also encompasses chip scale packaging.

The lead-free, tin-containing solder alloy will typically also be essentially free of one or more of Ni, Co, Cr, Mn, Zr, Fe and Si. However, the solder alloy may contain small amounts of one or more of these elements. The lead-free, tin-containing solder alloy is preferably based on a Sn—Cu alloy and will typically also include Ag.

Each of Ni, Co, Cr, Mn, Zr, Fe and Si will typically be present in the substrate (first aspect) or on a surface of the substrate (second aspect) or on a surface of the spheres or preform (third aspect) in an amount of up to 3 wt. %, more typically up to 2 wt. %.

The elements may be present singularly or in any combination of two or more thereof. The elements may be provided in the form of an alloy, i.e. in combination with another alloying element, which may be one of the other elements or a different element, such as copper.

Examples of alloy substrate materials include (wt. %): Cu-1Zr, Cu-2.35Fe-0.03P-0.12Zn, Cu-1.5Fe-0.18P-0.8Co-0.6Sn, Cu-0.6Fe-0.2P-0.05Mg, Cu-2.8Al-1.8Si-0.4Co, Cu-3.0Ni-0.65Si-0.15Mg, Cu-3.0Si-1.5Sn-0.1Cr. These are known copper alloys which can be readily made and obtained, and can be worked into shapes as required.

If the substrate is a printed wiring board, then it is preferably based on FR4 laminate.

The substrate will typically comprise an electrodeposited foil or a rolled foil bonded to another material. The electrodeposited foil or a rolled foil may have the alloy compositions as described herein. The electrodeposited foil or rolled foil will typically be bonded to a glass fibre epoxy laminate.

The substrate may further comprise one or more of silica, alumina, or other low CTE composite materials and/or highly thermally conductive materials.

The substrate may further comprise a solderability enhancing coating such as tin, gold and/or silver, including alloys thereof, or an organic coating.

The present invention also provides a printed wiring board substrate or a ball grid array substrate, the substrate being formed from an alloy comprising copper, optionally zinc, and one or more of Ni, Co, Cr, Mn, Zr, Fe and Si and/or an alloy of any one or more thereof.

Advantageously, in one preferred embodiment the substrate is formed from an alloy comprising:
95 wt. % or more Cu
at least one of
from 0.04 to 5% Zr
from 0.04 to 5% Fe
from 0.04 to 5% Si
and optionally one or more of
0-0.5 wt. % P
0-0.5 wt. % Mg
0-0.5 wt. % Zn
0-2 wt % Co
0-3 wt % Sn
0-4 wt % Ni
0-0.5 wt % Cr
0-4 wt % Al
and any unavoidable impurities.

In one preferred embodiment, the substrate is based in a Cu—Zr alloy and comprises at least 95% Cu and between about 0.04 and about 5% Zr, more preferably between about 0.5 and about 2% Zr. A specific example is Cu-1Zr.

In another preferred embodiment, the substrate comprises at least 95% Cu and between about 0.04 and about 5% Fe, more preferably between about 0.3 and about 4% Fe. In this embodiment the alloy may further comprise one or more of:
between about 0.01 and about 0.5% P
between about 0.01 and about 0.1% Mg
between about 0.01 and about 0.5% Zn
between about 0.04 and about 2% Co
between about 0.04 and about 2% Sn.

Examples of alloys in this embodiment include: Cu—Fe—P; Cu—Fe—P—X, where X is selected from Mg, Zn, Co and Sn; and Cu—Fe—P—X—Y, where X and Y are selected from Mg, Zn, Co and Sn (X is not the same as Y). Specific examples include Cu-0.6Fe-0.2P-0.05Mg, Cu-2.35Fe-0.03P-0.12Zn and Cu-1.5Fe-0.18P-0.8Co-0.6Sn.

In another preferred embodiment, the substrate comprises at least 95% Cu and between about 0.04 and about 5% Si, more preferably between about 0.3 and about 4% Si. In this embodiment the alloy may further comprise one or more of:
between about 0.04 and about 4% Ni
between about 0.04 and about 0.5% Mg
between about 0.04 and about 3% Sn
between about 0.01 and about 0.5% Cr
between about 0.04 and about 4% Al
between about 0.04 and about 1% Co Examples of alloys in this embodiment include: Cu—Si—X, where X is selected from Ni, Mg, Sn, Cr, Al and Co; and Cu—Fe—P—X—Y, where X and Y are selected from Ni, Mg, Sn, Cr, Al and Co (X is not the same as Y). Specific examples include Cu-0.65Si-3.0Ni-0.15Mg, Cu-3.0Si-1.5Sn-0.1Cr and Cu-1.8 Si-2.8Al-0.4Co.

The substrate may be formed from a material comprising copper and optionally also zinc, wherein a surface of the substrate has deposited thereon one or more of Ni, Co, Cr, Mn, Zr, Fe and Si and/or an alloy of any one or more thereof.

The substrate may have the alloy substrate compositions as described herein and may be provided in the form of an electrodeposited foil or a rolled foil, which may be bonded to a glass fibre epoxy laminate.

The present invention also provides a lead-free, tin-containing solder alloy in the form of spheres or a preform, wherein the surface of the spheres or preform has deposited thereon one or more of Ni, Co, Cr, Mn, Zr, Fe and Si and/or an alloy of any one or more thereof. A subsurface centre portion of the spheres or preform may be essentially free of one or more of Ni, Co, Cr, Mn, Zr, Fe and Si.

Alternatively, the bulk of the spheres or preform may contain small quantities of one or more of these elements.

Whatever the case, the concentration of the one or more of Ni, Co, Cr, Mn, Zr, Fe and Si is preferably highest at the surface of the spheres or preform. The solder alloy may be based, for example, on Sn—Cu, or Sn—Cu—Ag, or Sn—Ag or Sn—Zn.

The alloy according to the present invention or for use in the method according to the present invention may be supplied together with a flux.

In the foregoing passages, different aspects of the invention have been defined in more detail. Each aspect so defined may be combined with any other aspect or aspects unless clearly indicated to the contrary. In particular, any feature indicated as being preferred or advantageous may be combined with any other feature or features indicated as being preferred or advantageous.

EXAMPLE

The following is a non-limiting example to further describe the present invention.

SAC 305 solder spheres, Sn-3.0Ag-0.5Cu (wt %) were fluxed and soldered to a range of substrates in a reflow oven. The coupons so made were aged in air in an oven for 1000 hours, then sectioned and polished metallographically. Micrographs were taken and the thickness of the interfacial IMC measured.

Figure 1B:
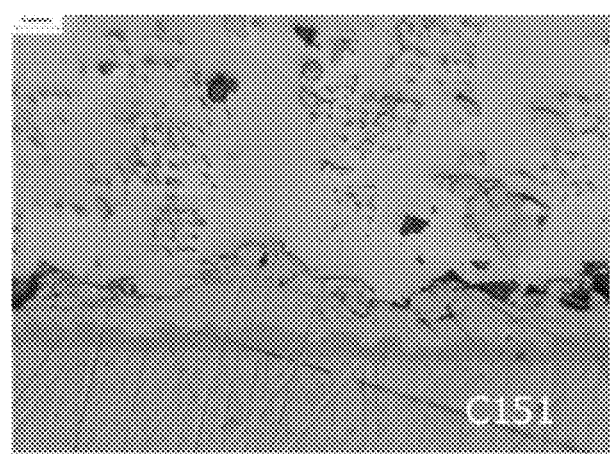
Figure 1C:
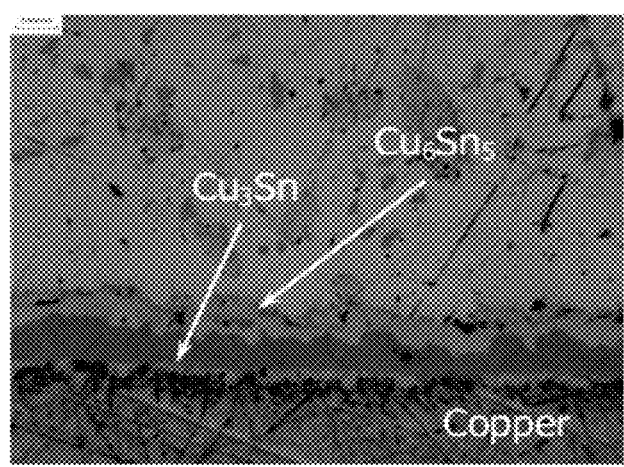

The micrographs in FIG. 1 compare the copper rich $Cu_3Sn$ growth on C151 and C197 compared with a pure copper substrate. The alloying additions in the substrate are effective in suppressing $Cu_3Sn$ IMC growth that is implicated in loss of solder joint reliability. IMC growth on a range of solderable lead-frame alloys after 1000 hour aging is summarized in Table 1.

TABLE 1

| Substrate Alloy | Average 1000 hour IMC Growth (microns) | | |
|---|---|---|---|
| | $Cu_3Sn$ | $Cu_6Sn_5$ | Total |
| Baseline: Copper | 4.4 | 4.2 | 8.6 |
| C151 | 2.7 | 6.5 | 9.2 |
| C197 | 2.0 | 6.7 | 8.7 |
| C194 | 1.4 | 15.6 | 17 |
| C7025 | 0 | 9.9 | 9.9 |
| C638 | 6.7 | 6.3 | 13 |

C151: Cu—1 wt % Zr
C197: Cu—0.6 Fe—0.2 P—0.05 Mg
C194: Cu—2.35 Fe—0.03 P—0.12 Zn
C7025 Cu—3.0 Ni—0.65 Si—0.15 Mg
C638: Cu—2.8 Al—1.8 Si—0.4 Co

The provision of alloying additions on the surface of solder pads/UBM can have the same beneficial effect.

The invention claimed is:

1. A method of forming a solder joint, comprising:
   (a) providing a lead-free, tin-containing solder alloy;
   (b) providing a printed wiring board substrate or a ball grid array substrate, said substrate being formed from a material comprising copper, and one or more of Ni, Co, Cr, Mn, Zr, Fe and Si and/or alloys thereof, and optionally also zinc;
   (c) heating the solder alloy; and
   (d) either before, during or after step (c) contacting the solder alloy with the substrate;
   wherein said material of the substrate comprises 95 wt % or more Cu and at least one selected from among 0.04 to 5 wt % Zr, 0.04 to 5 wt % Fe, and 0.04 to 5 wt % Si; and
   wherein the substrate is formed from one of the following alloy compositions (wt. %): Cu-1Zr, Cu-2.35Fe-0.03P-0.12Zn, Cu-1.5Fe-0.18P-0.8Co-0.6Sn, Cu-0.6Fe-0.2P-0.05Mg, Cu-2.8Al-1.8Si-0.4Co, Cu-3.0Ni-0.65Si-0.15Mg, Cu-3.0Si-1.5Sn-0.1Cr.

2. A method of forming a solder joint, comprising:
   (a) providing a lead-free, tin-containing solder alloy, wherein the lead-free, tin-containing solder is essentially free of Ni, Co, Cr, Mn, Zr, Fe and Si;
   (b) providing a printed wiring board substrate or a ball grid array substrate, said substrate being formed from a material comprising copper, and one or more of Ni, Co, Cr, Mn, Zr, Fe and Si and/or alloys thereof, and optionally also zinc;
   (c) heating the solder alloy; and
   (d) either before, during or after step (c) contacting the solder alloy with the substrate:
   wherein the lead-free, tin-containing solder is based on a Sn-Cu alloy including Ag.

3. A method of forming a solder joint, comprising:
   (a) providing a lead-free, tin-containing solder alloy;
   (b) providing a printed wiring board substrate or a ball grid array substrate, said substrate being formed from a material comprising copper, and one or more of Ni, Co, Cr, Mn, Zr, Fe and Si and/or alloys thereof, and optionally also zinc;
   (c) heating the solder alloy; and
   (d) either before, during or after step (c) contacting the solder alloy with the substrate:
   wherein said material of the substrate comprises 95 wt % or more Cu and at least one selected from among 0.04 to 5 wt % Zr, 0.04 to 5 wt % Fe, and 0.04 to 5 wt % Si; and
   wherein the lead-free, tin-containing solder is based on a Sn-Cu alloy including Ag.

4. The method of claim 1 wherein the lead-free, tin-containing solder is based on a Sn-Cu alloy including Ag.

5. The method of claim 1 wherein the lead-free, tin-containing solder is essentially free of Ni.

6. The method of claim 3 wherein the lead-free, tin-containing solder is essentially free of Ni.

7. The method of claim 1 wherein the lead-free, tin-containing solder is essentially free of Ni, Co, Cr, Mn, Zr, Fe, and Si.

8. The method of claim 3 wherein the lead-free, tin-containing solder is essentially free of Ni, Co, Cr, Mn, Zr, Fe, and Si.

9. A method of forming a solder joint, comprising:
   (a) providing a lead-free, tin-containing solder alloy based on a Sn-Cu alloy including Ag;
   (b) providing a printed wiring board substrate or a ball grid array substrate, said substrate being formed from a material comprising copper, and one or more of Ni, Co, Cr, Mn, Zr, Fe and Si and/or alloys thereof, and optionally also zinc;
   (c) heating the solder alloy; and
   (d) either before, during or after step (c) contacting the solder alloy with the substrate.

10. The method of claim 9 wherein in said material comprising copper and one or more of Ni, Co, Cr, Mn, Zr, Fe and Si and/or alloys thereof, each of said Ni, Co, Cr, Mn, Zr, Fe and Si has a concentration up to 3 wt %.

11. The method of claim 9 wherein the substrate comprises an electrodeposited foil or rolled foil bonded to a glass fiber epoxy laminate.

12. The method of claim 9 wherein said material comprising copper and one or more of Ni, Co, Cr, Mn, Zr, Fe and Si and/or alloys thereof comprises:
   95 wt. % or more Cu
   at least one of
      from 0.04 to 5% Zr
      from 0.04 to 5% Fe
      from 0.04 to 5% Si
   and optionally one or more of
      0-0.5 wt. % P
      0-0.5 wt. % Mg
      0-0.5 wt. % Zn
      0-2 wt % Co
      0-3 wt % Sn
      0-4 wt % Ni
      0-0.5 wt % Cr
      0-4 wt % Al
   and any unavoidable impurities.

13. The method of claim 9 wherein said material comprising copper and one or more of Ni, Co, Cr, Mn, Zr, Fe and Si and/or alloys thereof comprises at least 95 wt % Cu and between about 0.5 and about 2 wt % Zr.

14. The method of claim 9 wherein said material comprising copper and one or more of Ni, Co, Cr, Mn, Zr, Fe and Si and/or alloys thereof comprises at least 95 wt % Cu and between about 0.3 and about 4 wt % Fe.

15. The method of claim 9 wherein said material comprising copper and one or more of Ni, Co, Cr, Mn, Zr, Fe and Si and/or alloys thereof comprises at least 95 wt % Cu and between about 0.3 and about 4 wt % Si.

16. the method of claim 11 wherein the lead-free, tin-containing solder is essentially free of Ni, Co, Cr, Mn, Zr, Fe, and Si.

17. The method of claim 9 wherein the lead-free, Sn-containing solder is Sn-3.0Ag-0.5Cu (wt %).

18. The method of claim 2 wherein the substrate comprises an electrodeposited foil or rolled foil bonded to a glass fiber epoxy laminate.

19. The method of claim 3 wherein the substrate comprises an electrodeposited foil or rolled foil bonded to a glass fiber epoxy laminate.

20. The method of claim 2 wherein the lead-free, Sn-containing solder is Sn-3.0Ag-0.5Cu (wt %).

21. The method of claim 3 wherein the lead-free, Sn-containing solder is Sn-3.0Ag-0.5Cu (wt %).

* * * * *